(12) United States Patent
Uhlemann

(10) Patent No.: US 7,800,074 B2
(45) Date of Patent: Sep. 21, 2010

(54) ELECTRON-OPTICAL CORRECTOR FOR AN APLANATIC IMAGING SYSTEM

(76) Inventor: Stephan Uhlemann, Bahnhofstraβe 3, 69115 Heidelberg (DE)

( * ) Notice: Subject to any disclaimer, the term of this patent is extended or adjusted under 35 U.S.C. 154(b) by 279 days.

(21) Appl. No.: 12/091,411

(22) PCT Filed: Oct. 11, 2006

(86) PCT No.: PCT/DE2006/001773

§ 371 (c)(1),
(2), (4) Date: Jul. 8, 2008

(87) PCT Pub. No.: WO2007/065388

PCT Pub. Date: Jun. 14, 2007

(65) Prior Publication Data

US 2008/0265172 A1   Oct. 30, 2008

(30) Foreign Application Priority Data

Oct. 24, 2005   (DE) .................. 10 2005 050 810

(51) Int. Cl.
*H01J 37/153* (2006.01)

(52) U.S. Cl. .................. 250/396 R; 250/310; 250/311

(58) Field of Classification Search ............. 250/396 R, 250/396 ML, 398, 310, 311
See application file for complete search history.

(56) References Cited

U.S. PATENT DOCUMENTS

| | | | | |
|---|---|---|---|---|
| 5,084,622 A * | 1/1992 | Rose | ................ | 250/396 R |
| 6,605,810 B1 * | 8/2003 | Haider et al. | ........... | 250/396 R |
| 6,861,651 B2 * | 3/2005 | Rose | ................ | 250/396 R |
| 7,060,985 B2 * | 6/2006 | Hosokawa | ............ | 250/396 R |
| 2009/0134339 A1 * | 5/2009 | Uhlemann et al. | ...... | 250/396 R |

* cited by examiner

*Primary Examiner*—Jack I Berman
(74) *Attorney, Agent, or Firm*—Edwin D. Schindler

(57) ABSTRACT

An electron-optical corrector for rendering superfluous both the third-order opening error and the anisotropic part of the extra-axial third-order coma, using round lenses and hexapole fields, the corrector includes at least three coaxially arranged hexapole fields with at least one round lens field is arranged between adjacent hexapole fields, so that the hexapole fields are imaged onto each other in pairs. The intensities of the hexapole fields are selected so that the image error coefficient of the three-fold astigmatism is equal to 0, and at least three hexapole fields in the Larmor reference system are rotated in relation to each other at an angle about the optical axis.

19 Claims, 4 Drawing Sheets

ELECTRON-OPTICAL CORRECTOR FOR AN APLANATIC IMAGING SYSTEM

BACKGROUND OF THE INVENTION

1. Technical Field of the Invention

Figure 1:
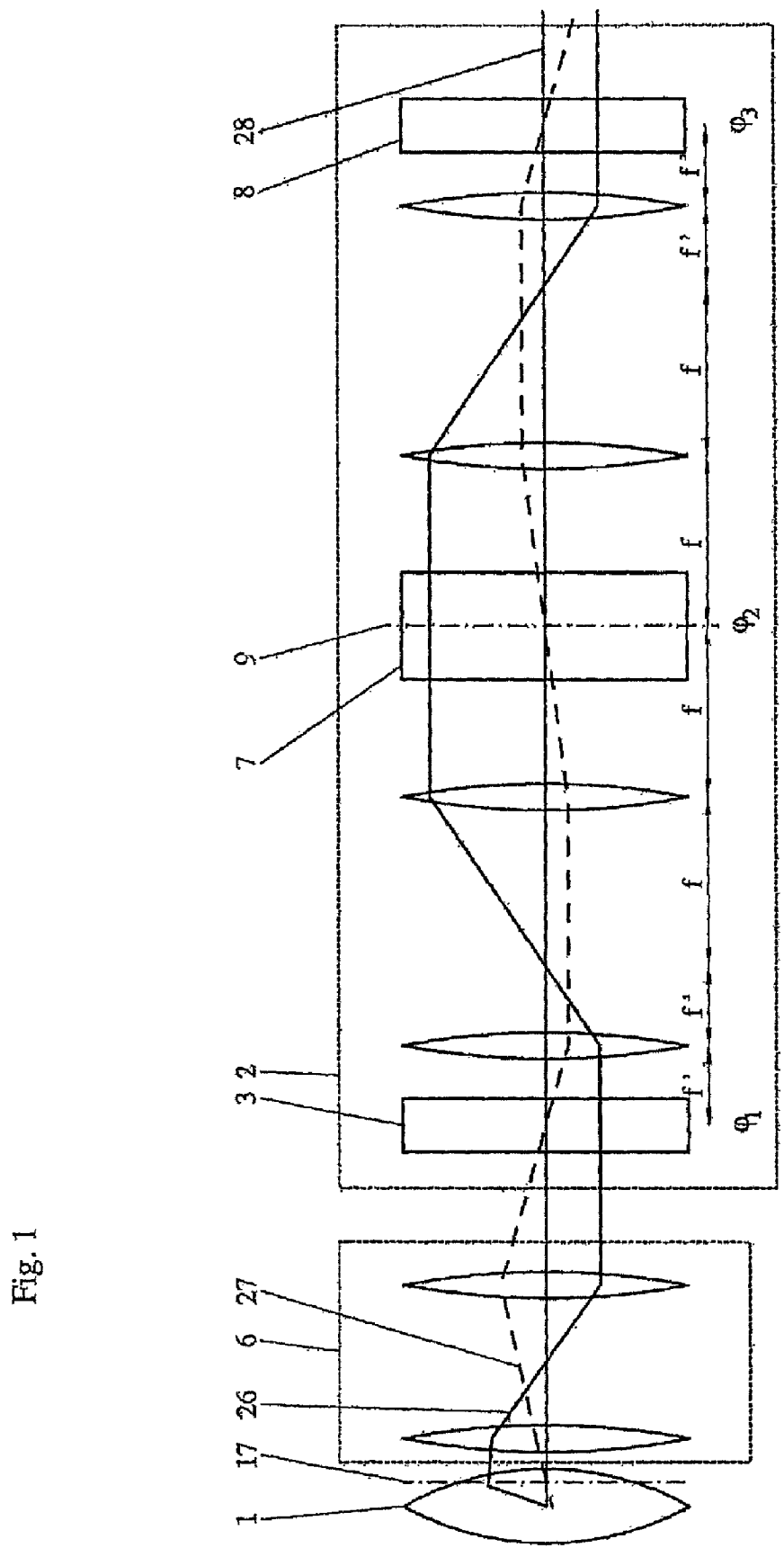

The invention relates to an electron-optical corrector for eliminating both the third-order spherical aberration and the anisotropic (azimuthal) component of the third-order extra-axial coma using circular lenses and hexapole fields.

2. Description of the Prior Art

The efficiency of high-resolution imaging electron-optical systems, such as, for example, high-resolution electron microscopy, is limited by third-order spherical aberrations. Therefore, it is a principal concern in the modification of such systems to eliminate third-order spherical aberration. Another important criterion in the efficiency, besides high resolution, is to be able to image an image region of sufficient size. Its limit is determined in high-resolution electron-optical systems by the aberration of extra-axial coma, which is composed of the components of the radial coma, often also described as isotropic coma, and azimuthal coma, which is also known as anisotropic coma. Accordingly, the terms "radial" and "azimuthal" are used in one terminological system, and "isotropic" and "anisotropic" in the other terminological system. According to the conventional terminology, electron-optical imaging systems that contain no third-order spherical aberration and no extra-axial coma are termed aplanats. Derived from this, systems are termed semi-aplanats if, besides absence of third-order spherical aberration, they are only free of radial (isotropic) coma. In the case of electron-optical systems with a straight axis and circular Gaussian ray path, which are always assumed to be the case below, the third-order aberration consists of the third-order spherical aberration. The term spherical aberration covers all those optical image defects whose aberration integrals include only those Gaussian elementary paths that emerge from the optical axis in the object plane to be imaged. The magnitude of the object/image field to be imaged is determined by extra-axial aberration, that is to say, those aberrations whose aberration integrals also contain elementary paths according to Gaussian dioptrics that emerge in the object plane outside the optical axis. In high-resolution electron optics, the image aberration of extra-axial coma is the main factor limiting the image field.

German patent application DE 198 02 409, for which Haider et al., U.S. Pat. No. 6,605,810 B1, issued Aug. 12, 2003, is an English-language equivalent, describes a corrective in which two hexapoles are used, between which a round-lens doublet is interposed. Between the corrective comprising the lenses and the objective lens, a further circular lens is interposed such that the coma-free plane of the objective lens is imaged in the coma-free plane of the corrective. But the term "coma-free plane," or more precisely "coma-free diaphragm plane," strictly speaking, describes the property "free of isotropic (radial) coma." A corrective of this construction is thus the elimination of the third-order spherical aberration of the objective lens, avoiding the radial (isotropic) component of the extra-axial coma. According to the conventional terminology detailed above, the system, comprising objective lens, transfer system and corrective, in result, represents a semi-aplanat.

In the above-described arrangement, it is a disadvantage that, as a result of the unavoidable anisotropic extra-axial coma of the magnetic objective lens, which is not influenced by the corrective, a restriction of the focused image region takes place, which could be considerably enlarged by complete elimination of this image aberration.

SUMMARY OF THE INVENTION

On this basis, it is the object of the invention to provide an electron-optical corrective which, besides elimination of the third-order spherical aberration, also has as its object elimination of the azimuthal (anisotropic) extra-axial coma.

This object is achieved according to the invention in that the corrector consists of at least three coaxially arranged hexapole fields, at least one circular lens field being arranged between adjacent hexapole fields such that the hexapole fields are imaged on one another in pairs and the intensities of the hexapole fields are chosen such that the image aberration coefficient of the astigmatism with three-fold symmetry becomes 0 and at least three hexapole fields in the Larmor reference system are rotated relative to one another by an angle about the optical axis.

The objective of a corrective consists in eliminating, or at least reducing, the image aberration of an objective lens, with which the corrective cooperates. Thus, in the scope of the invention, it is in principle free whether the corrective and the transfer lens system are interposed before or after the lens. Below, the lens to be corrected, that is to say, the objective lens, which is usually a magnetic lens, is not mentioned, and primarily the construction of the corrective is described. In its principle construction, the corrective consists of three or more hexapole fields and circular lenses interposed between them, which in their entirety form the corrective. The intensities of the hexapole field are chosen such that the astigmatism, with three-fold symmetry, disappears.

Because of the existing axial magnetic fields, there is a rotation of the path of the electrons, in general, the electrically charged particle stream. A simplification of the description of the physical conditions can be achieved by representation in a coordinate system that moves corresponding to the rotational motion of the electrons, and which is termed the Larmor reference system. The rotation of the hexapole fields described in the scope of this invention is always measured relative to the Larmor reference system.

The, at least, three hexapole fields are rotated relative to one another with respect to the optical axis, such that a correction of the anisotropic extra-axial coma takes place. In practice, one of the hexapoles is kept spatially fixed and the other rotated relative to it until the elimination of the image aberration of the anisotropic extra-axial coma takes place. The procedure can be performed either by experimental adjustment or else by mathematical determination of the angle of rotation and a consequent adjustment.

In this manner, a corrective is obtained that, besides the third-order spherical aberration, also additionally permits the azimuthal component of the extra-axial coma to be eliminated. By connecting together with an objective lens, a correction of the entire system, comprising an objective lens and corrector, can be achieved. Moreover, with a suitable choice of the lengths and thicknesses of the hexapole fields, their orientation and the focal lengths of the circular lenses, complete elimination of all second-order aberrations, all fourth-order axial image aberrations and a complete or partial symmetry correction of the generalized fourth-order comas can be achieved.

In principle, the condition of complete error correction does not need to be precisely maintained, since slight deviations from this arrangement are caused by the occurrence of further image aberrations, which, however, can be used to compensate existing image aberrations of a corresponding kind. The occurrence of additional image aberrations, which is per se disadvantageous, could be considered as an advantage as regards the possibility of its utilization for compensating existing image aberrations.

The assignment of the hexapole fields to the circular lenses must take place such that they image the hexapole fields on one another in pairs.

An arrangement that always fulfills this condition arises when, by virtue of the circular lenses, imaging of adjacent hexapoles on one another takes place. Another special solution would be to adjust the circular lenses, such that they image the hexapole alternately, that is to say, on the next-but-one hexapole.

With one-fold symmetrical construction of the correction, in which the axial fundamental path is approximately symmetrical to the center plane of the corrector, but the extra-axial fundamental path is approximately antisymmetrical to the center plane, the adjustment of the focal lengths of the circular lens and the lengths of the hexapole fields can be used to avoid, besides the above-described image aberrations (spherical aberrations, extra-axial coma), additionally also the axial three-leaf-clover aberrations and distortion with three-fold symmetry, and partly also image aberration coefficients of the generalized fourth-order Seidel comas.

In the case of a corrective built up from three hexapole fields, it is advisable to choose the angle of rotation of the hexapole fields equidistantly around the optical axis. The angle of the first hexapole field is $\phi_1=\phi+\Delta$; that of the second hexapole field $\phi_2=\phi$, and that of the third hexapole field $\phi_3=\phi-\Delta$. The magnitude of $\Delta$ should be chosen such that the anisotropic (azimuthal) coma is compensated. If the value $\Delta$ becomes 0, on the other hand, so that the axes of all three hexapoles coincide, there is no correction of the anisotropic coma, but only that of the third-order spherical aberration.

A particularly advantageous embodiment consists in using five hexapole fields, in which the hexapole fields are oriented around the optical axis such that $\phi_1=\phi$, $\phi_2=\phi\pm30°$, $\phi_3=\phi+60°$, $\phi_4=\pm-30°$, and $\phi_5=\phi$. Here, the choice of sign is determined only by the direction of rotation of the front lens. The elimination of the anisotropic (azimuthal) coma of the magnetic front lens can be adjusted separately via the intensity of the hexapole fields of the second and fourth correction piece.

In a further embodiment with a larger number of correction pieces, it is advisable to construction the corrector so as to be double-symmetrical, so as to generate a double-symmetrical ray path, such that the axial fundamental path is antisymmetrical to the center plane of the corrector, but symmetrical to the center plane of the first and second half of the corrector. The extra-axial fundamental paths are symmetrical with respect to the center plane of the corrector and antisymmetrical with respect to the center planes of the first and second halves of the corrector. The amplitudes of the hexapole fields here should be chosen so as to be symmetrical to all three planes.

In a system consisting of six hexapole fields, the correction of the anisotropic coma takes place either via the adjustment of the intensity of the second and penultimate hexapole field if the angles of rotation are as follows:

$\phi_1=\phi$, $\phi_2=\phi\pm30°$, $\phi_3=\phi+60°$, $\phi_4=\phi$ and $\phi_5=\phi\pm30°$ und $\phi_1=\phi+60°$.

In an arrangement consisting of six correction pieces, the correction of the anisotropic coma is also possible via the choice of angle differential, if the rotation of the individual correction pieces is chosen as follows:

$\phi_1=\phi+\Delta$, $\phi_2=\phi$, $\phi_3=\phi-\Delta$, $\phi_4=\phi+\Delta$, $\phi_5=\phi$ and $\phi_6=\phi-\Delta$ With a double-symmetrical construction of the correction, the focal lengths and lengths of the hexapole fields are chosen freely, since the axial three-leaf-clover aberrations, the threefold symmetry distortion and the generalized fourth-order Seidel comas disappear by virtue of the symmetrical correction.

The generation of the hexapole field is basically free within the scope of the invention. The hexapole field is generated after the use of a multipole element with six-fold rotational symmetry. It is also possible to use a multi-pole element with twelve-fold rotational symmetry and to obtain a hexapole field by co-directional application to adjacent pole elements. Through retroactively changing the application of one individual polar element, rotation and adjustment of the electrical and/or magnetic hexapole field can be achieved while maintaining the mechanical positioning.

In one embodiment, finally, a circular lens is composed of two or more magnetic lens fields, such that the respective intensities are available as parameters for setting and adjusting. Such an arrangement generates a circular lens field that, with an appropriate choice of the respective intensity, enables the Larmor rotation of the field to be adjusted in the desired manner while retaining the refractive power of the lens. The two degrees of freedom of the setting of the intensities of the two magnetic lenses includes the possibility of setting the refractive power and Larmor rotation of the entire circular lens independently of one another.

The arrangement of the above-described corrective has the result that, besides the elimination of the third-order spherical aberration, the third-order Seidel anisotropic (azimuthal) extra-axial coma can also be eliminated. In practice, the magnetic objective lens provides the dominant contribution to the extra-axial coma. Through the imaging the coma-free plane of the objective lens in the first hexapole field of the corrector, it is often not necessary to make any additional efforts to eliminate the isotropic (radial) coma when the above-described corrective is used, since the hexapole field and its center plane lie close to the coma-free plane and, consequently, the isotropic (radial) coma is low.

For the transfer lens system between the corrector and objective, there are two alternatives: The transfer lens system can consist of a single circular lens, which is to be adjusted as regards its intensity and position, such that the coma-free plane of the object lens is imaged in the coma-free plane of the corrective.

The alternative consists in using a circular lens doublet as transfer lens system between the objective lens and corrector. Here, too, the adjustment takes place such that the coma-free plane of the objective lens is imaged in the coma-free plane of the corrective.

These measures ensure that, in addition to the above-described image aberrations, the isotropic (radial) coma can be avoided. An arrangement is then obtained that possesses the properties of an aplanat.

For the possibility of correction, it is immaterial whether the correction is arranged in the direction of the ray path and possibly with the interposition of transfer lenses behind the correcting lens, or whether the corrector and any transfer lenses are arranged in front of the lens to be corrected. The aim is always, by adjusting the corrector or transfer lenses, to achieve a complete elimination of particular image aberrations of the entire optical system.

BRIEF DESCRIPTION OF THE DRAWING FIGURES

Figure 2:
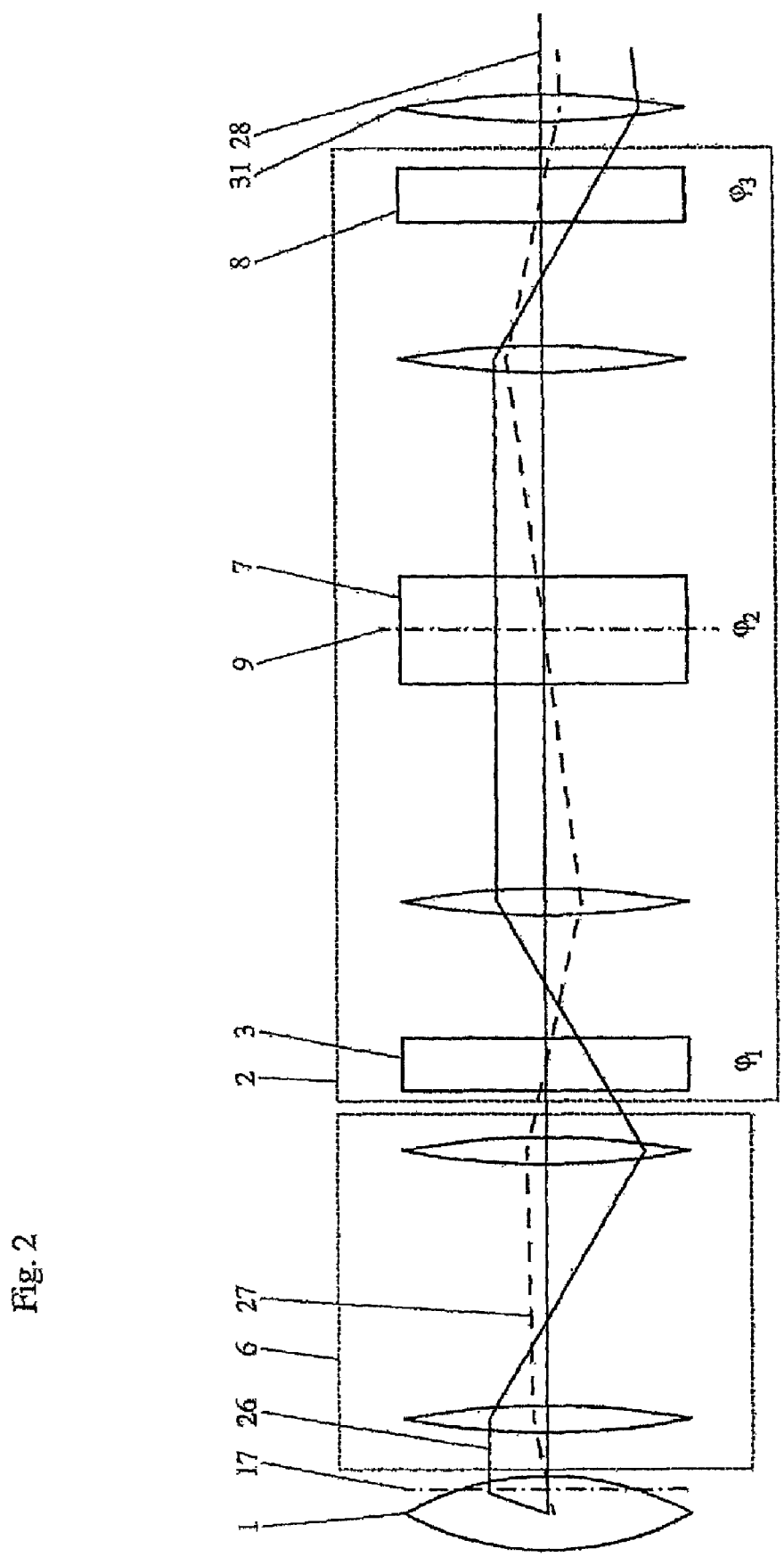
Figure 3:
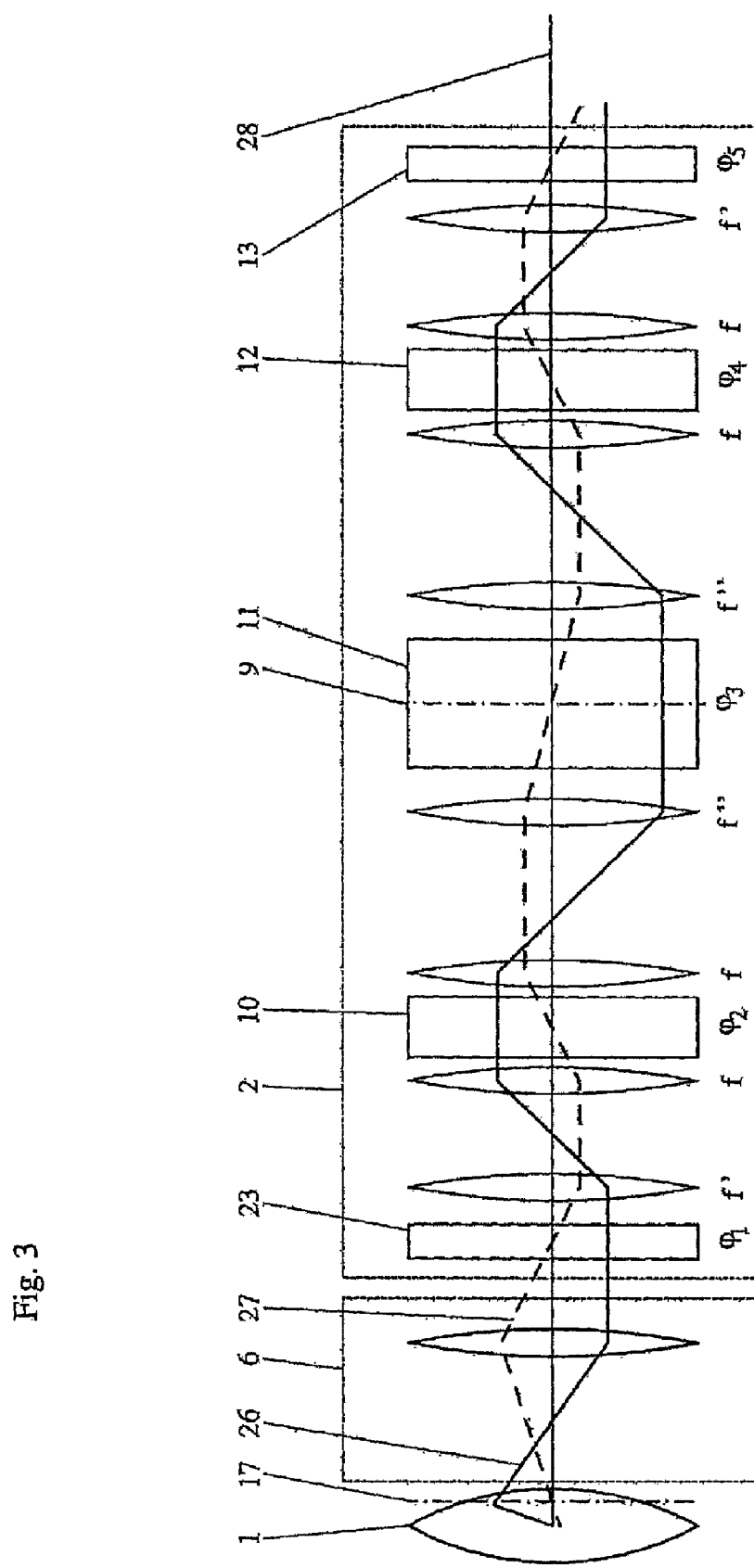
Figure 4:
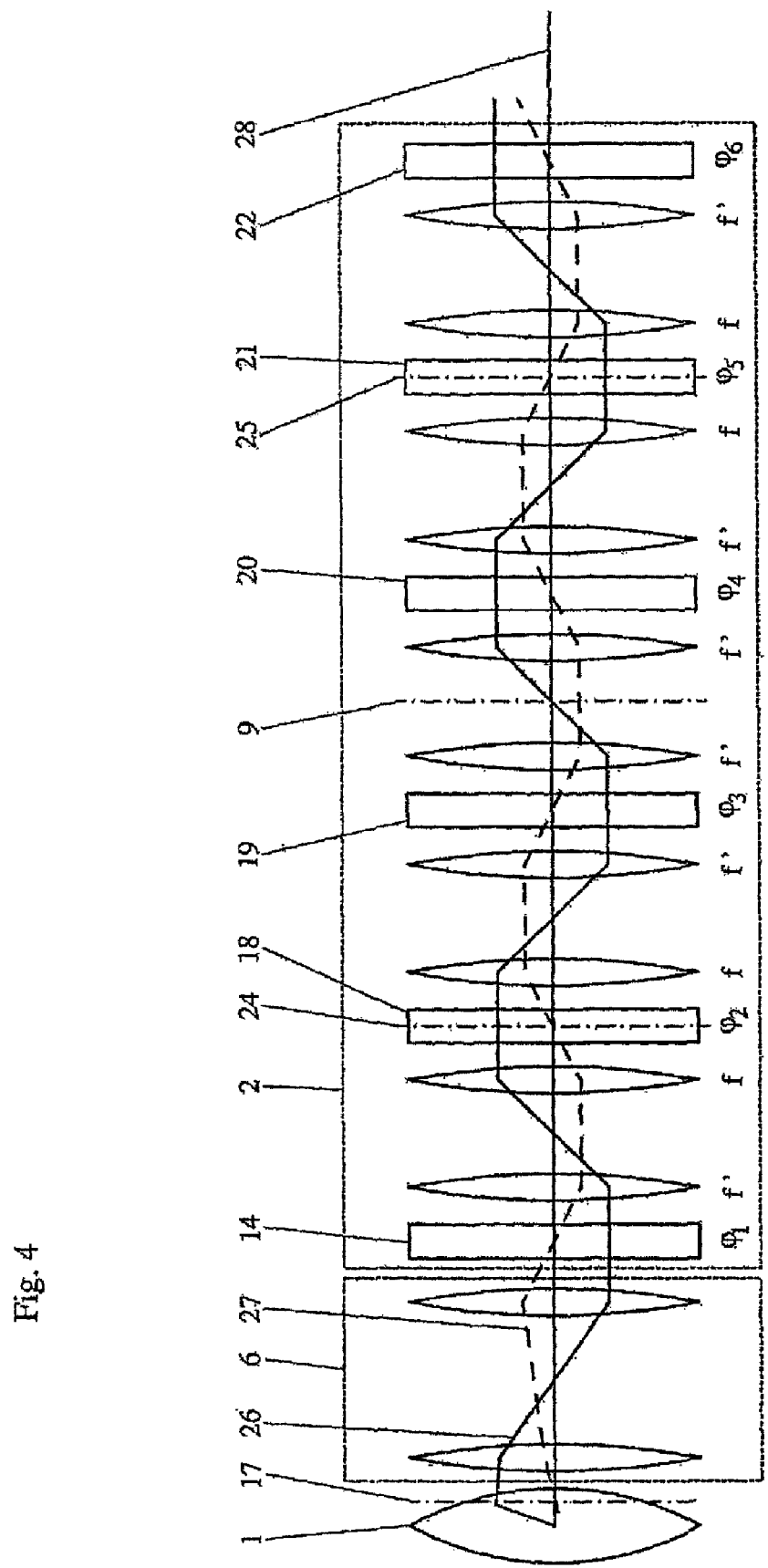

Further details, features and advantages of the invention can be taken from the following descriptive part, in which exemplary embodiments of the invention are explained with reference to the drawing, wherein FIG. 1 shows a corrector with three correction pieces;
FIG. 2 shows a corrector also with three correction pieces;
FIG. 3 shows a corrector with five correction pieces;
FIG. 4 shows a corrector with six correction pieces.

DETAILED DESCRIPTION OF THE DRAWING FIGURES AND PREFERRED EMBODIMENTS

FIG. 1 shows, in a schematic side view, the construction of an electron-optical arrangement, consisting of an objective lens 1, which is usually a magnetic circular lens, a corrector 2 and a transfer lens system arranged between them. All these individual elements have optical axis 28 in common.

The corrector 2 contains a total of 3 hexapole fields (3, 7 and 8) and interposed circular lenses, which are arranged one behind the other and in their entirety form the corrector 2. In the direction of the ray path there stands a first hexapole field 3, shown as a rectangle, a first circular lens with the focal length f'. The distance between the circular lens and the center plane corresponds to the focal length f'. The angle or rotation, by which the hexapole field is oriented around the optical axis, is $\phi_1$.

This is followed by a further hexapole field (7) and two circular lenses, whose focal length f defines the distance to the plane of symmetry (9) of the corrective.

Continuing along the ray path, there follows a circular lens and the third, and thereby the last, hexapole field (8), which is constructed so as to be mirror symmetrical to the first.

The entire arrangement is mirror symmetrical to the center plane 9. The angle of the hexapole field 7 is $\phi_2$; that of the hexapole field 8 is $\phi_3$. As a result, all three hexapole fields are rotated in different angles around the optical axis. The adjustment of the angle of rotation and the hexapole field intensities should be chosen such that, besides the third-order spherical aberrration, the anisotropic (azimuthal) third-order extra-axial coma is eliminated. Finally the setting must take place such that the image aberrations of the entire system, that is to say, the image aberrations generated by the objective lens 1, are compensated. Between the objective lens 1 and the corrector, there is interposed a transfer lens system 6 consisting of two circular lenses. It is set in such a way that the coma-free plane 17 of the objective lens 1 is imaged in the coma-free plane of the corrector 2. The axial fundamental path 26 has the profile shown in the figure. By appropriate setting of the transfer lens system 6, in total, with corrector 2, a correction system is obtained that is capable of eliminating both the third-order spherical aberration and the extra-axial coma, namely, both their isotropic (radial) and anisotropic (azimuthal) components.

A construction deviating from this is shown in FIG. 2. In this case, only one circular lens in each case is arranged between the hexapoles. As in FIG. 1, the setting and spatial arrangement of hexapole fields and circular lenses is such that the hexapoles are imaged on one another. Behind the corrector, a typically used adapter lens (31) is arranged, by way of example, which adjusts a parallel or convergent axial ray path behind the corrective.

Between the objective lens 1 and the corrector 2, there is also interposed a transfer lens system 6 consisting of two circular lenses. Here too the arrangement and setting of the transfer lens system 6 is such that the coma-free plane 17 of the objective lens 1 is imaged in the coma-free plane of the corrector (2). By this means there is both a compensation of the isotropic component of the extra-axial coma besides that of the third-order spherical aberration and that of the anisotropic (azimuthal) component of the extra-axial coma.

The corrector shown in FIG. 3 consists of a total of 5 hexapole fields 23, 10, 11, 12, 13 and in each case two interposed circular lenses. The overall construction of the corrector 2 is symmetrical to the center plane 9 as regard the amplitudes of the hexapole fields and the focal lengths of the circular lens fields. The angles of rotation of the hexapole fields are designated $\phi_1$, $\phi_2$, $\phi_3$, $\phi_4$ and $\phi_5$.

Between the objective lens 1 and the corrector, there is arranged a transfer lens system 6 consisting of a circular lens.

The advantage of this arrangement consists in the fact that, for a given orientation of the hexapoles at an angle $\phi_i$, the setting of the correction of the anisotropic coma can take place via the intensity of the hexapoles 10 and 12. A change of the angle of rotation $\phi_i$ of the individual correction pieces is thus not necessary for adjusting the compensation.

FIG. 4, finally, shows a corrector 2 that is doubly symmetrically constructed of hexapole fields (14, 18, 19, 20, 21, 22) and circular lenses. Consequently, a double-symmetrical ray path is generated in which the axial fundamental path 26 is symmetrical to the center plane 9 of the corrector 2 and symmetrical with respect to the center planes 24 and 25 of the first and second half of the corrector. The extra-axial fundamental path 27, on the other hand, is symmetrical with respect to this center plane 9 and antisymmetrical with respect to the planes 24 and 25. The amplitudes of the hexapole fields are symmetrical here, both with respect to the center plane 9 and to the planes 24, 25. The compensation of the image aberration of the anisotropic extra-axial coma, for a constant angular setting $\phi_1$ can be carried out by corresponding choice of the amplitudes of the hexapole fields 18, 21, that is to say, those that lie in the planes 24, 25, or with constant pole intensities through corresponding choice of the angle of rotation of the individual correction pieces in their angle $\phi$.

The invention claimed is:

1. An electron-optical corrector for eliminating both third-order spherical aberration and anisotropic component of a third-order extra-axial coma using circular lenses and hexapole fields, said electron-optical corrector comprising:
   at least three coaxially arranged hexapole fields; and,
   at least one circular lens field between adjacent said hexapole fields for imaging said hexapole fields onto one another in pairs, said hexapole fields having intensities chosen so that an image aberration coefficient of an astigmatism with three-fold symmetry becomes 0 and at least three hexapole fields in a Larmor reference system are rotated relative to one another by an angle about an optical axis.

2. The electron-optical corrector according to claim 1, wherein said circular lenses are adjustable for imaging adjacent said hexapole fields on one another.

3. The electron-optical corrector according to claim 1, wherein said circular lenses are adjustable for alternately imaging said hexapole fields on one another.

4. The electron-optical corrector according to claim 1, further comprising an axial fundamental path symmetrical to a center plane of said electron-optical corrector when said electron-optical corrector is symmetrically constructed, and an extra-axial fundamental path that is anti-symmetrical to the center plane.

5. The electron-optical corrector according to claim 4, wherein three hexapole fields of said hexapole fields are arranged equidistantly with respect to their angle of rotation in the Larmor reference system.

6. The electron-optical corrector according to claim 4, where five hexapole fields of said hexapole fields and orientations of said five hexapole fields with respect to their angle of rotation in the Larmor reference systems are $\phi_1=\phi$, $\phi_2=\phi\pm30°$, $\phi_3=\phi+60°$, $\phi_4=\phi\pm30°$, and $\phi_5=\phi$ betragen.

7. The electron-optical corrector according to claim 1, further comprising an axial fundamental path that is anti-symmetrical to a first center plane and symmetrical to a second center plane and a third center plane of a first half and a second half of said electron-optical corrector when said electron-optical corrector is doubly symmetrically constructed, and an extra-axial fundamental path is symmetrical to the first center plane and anti-symmetrical to the second center plane and the third center plane.

8. The electron-optical corrector according to claim 7, wherein six hexapole fields of said hexapole fields and angles of said six hexapole fields in Larmor reference systems are $\phi_1=\phi$, $\phi_2=\phi\pm30°$, $\phi_3=\phi+60°$, $\phi_4=\phi$, $\phi_5=\phi\pm30°$ and $\phi_6=\phi+60°$.

9. The electron-optical corrector according to claim 7, wherein six hexapole fields of said hexapole fields and orientations of fields in Larmor reference systems are $\phi_1=\phi+\Delta\phi$, $\phi_2=\phi$, $\phi_3=\phi-\Delta\phi$, $\phi_4=\phi+\Delta\phi$, $\phi_5=\phi$, $\phi_6=\phi$, and the value $\Delta\phi$ is adjustable.

10. The electron-optical corrector according to claim 1, wherein at least one hexapole field of said hexapole fields is generated by a multipole element with six-fold rotational symmetry.

11. The electron-optical corrector according to claim 1, wherein at least one hexapole field of said hexapole fields is generated by a multipole element with twelve-fold rotational symmetry.

12. The electron-optical corrector according to claim 1, wherein said at least one circular lens field includes a circular lens comprised of at least two magnetic lenses that are adjustable as regards their respective intensities, so that their Larmor rotation is adjustable while maintaining refractive power of said circular lens.

13. The electron-optical corrector according to claim 1, further comprising an objective lens that is adjustable for imaging a coma-free plane of said objective lens in a plane of a first hexapole.

14. A transfer lens system in combination with an electron-optical corrector for eliminating both third-order spherical aberration and anisotropic component of a third-order extra-axial coma using circular lenses and hexapole fields, comprising:
an electron-optical corrector including:
at least three coaxially arranged hexapole fields; and,
at least one circular lens field between adjacent said hexapole fields for imaging said hexapole fields onto one another in pairs, said hexapole fields having intensities chosen so that an image aberration coefficient of an astigmatism with three-fold symmetry becomes 0 and at least three hexapole fields in a Larmor reference system are rotated relative to one another by an angle about an optical axis; and,
a transfer lens system preceding said electron-optical corrector, said transfer lens system including:
a circular lens imaging a coma-free plane of an objective lens in the coma-free plane of a corrective.

15. The transfer lens system in combination with an electron-optical corrector according to claim 14, wherein said objective lens and said transfer lens system are connected in front of said electron-optical corrector in a direction of a ray path.

16. The transfer lens system in combination with an electron-optical corrector according to claim 14, wherein said objective lens and said transfer lens system are connected behind said electron-optical corrector in a direction of a ray path.

17. A transfer lens system in combination with an electron-optical corrector for eliminating both third-order spherical aberration and anisotropic component of a third-order extra-axial coma using circular lenses and hexapole fields, comprising:
an electron-optical corrector including:
at least three coaxially arranged hexapole fields; and,
at least one circular lens field between adjacent said hexapole fields for imaging said hexapole fields onto one another in pairs, said hexapole fields having intensities chosen so that an image aberration coefficient of an astigmatism with three-fold symmetry becomes 0 and at least three hexapole fields in a Larmor reference system are rotated relative to one another by an angle about an optical axis; and,
a transfer lens system preceding said electron-optical corrector, said transfer lens system including:
circular-lens doublet imaging a coma-free plane of an objective lens in the coma-free plane of a corrective.

18. The transfer lens system in combination with an electron-optical corrector according to claim 17, wherein said objective lens and said transfer lens system are connected in front of said electron-optical corrector in a direction of a ray path.

19. The transfer lens system in combination with an electron-optical corrector according to claim 17, wherein said objective lens and said transfer lens system are connected behind said electron-optical corrector in a direction of a ray path.

* * * * *